(12) United States Patent
Pitwon et al.

(10) Patent No.: US 9,615,485 B1
(45) Date of Patent: Apr. 4, 2017

(54) COMPUTING SYSTEM ENCLOSURE AIRFLOW MANAGEMENT

(71) Applicant: Seagate Technology LLC, Cupertino, CA (US)

(72) Inventors: Richard Charles Alexander Pitwon, Fareham (GB); David Michael Davis, Portsmouth (GB); Myles Edward Richard Spence, Stevenage (GB)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 16 days.

(21) Appl. No.: 14/868,902

(22) Filed: Sep. 29, 2015

(51) Int. Cl.
H05K 7/20 (2006.01)

(52) U.S. Cl.
CPC ..... H05K 7/20145 (2013.01); H05K 7/20209 (2013.01)

(58) Field of Classification Search
CPC ........... H05K 7/20145; H05K 7/20209; H05K 7/20136; H05K 7/20154; H05K 7/20163; H05K 7/20172; H05K 7/20181; H05K 7/2019; H05K 7/202
USPC ......................... 361/679.48–679.51, 690–695
See application file for complete search history.

(56) References Cited

U.S. PATENT DOCUMENTS

| | | | |
|---|---|---|---|
| 6,330,157 B1 * | 12/2001 | Bezama | H01L 23/34 165/185 |
| 6,957,544 B2 | 10/2005 | Dobbs et al. | |
| 6,991,533 B2 | 1/2006 | Tsai et al. | |
| 7,251,547 B2 | 7/2007 | Bash et al. | |
| 7,362,032 B2 * | 4/2008 | Pelrine | A61M 5/142 310/309 |
| 7,682,234 B1 | 3/2010 | Beitelmal et al. | |
| 8,183,739 B2 | 5/2012 | Heim | |
| 8,190,303 B2 | 5/2012 | Lin et al. | |
| 8,397,088 B1 | 3/2013 | Ghose | |
| 8,432,700 B2 | 4/2013 | Katakura et al. | |
| 8,462,502 B2 | 6/2013 | Hirano et al. | |
| 8,744,631 B2 | 6/2014 | Wang et al. | |
| 8,882,572 B2 | 11/2014 | McReynolds et al. | |
| 8,885,335 B2 | 11/2014 | Magarelli | |
| 8,939,824 B1 | 1/2015 | Bash et al. | |
| 2005/0165586 A1 | 7/2005 | Moore | |

(Continued)

FOREIGN PATENT DOCUMENTS

JP 2013-114735 A 6/2013

*Primary Examiner* — Anthony Haughton
*Assistant Examiner* — Yahya Ahmad
(74) *Attorney, Agent, or Firm* — Holzer Patel Drennan (57) ABSTRACT

The disclosed technology provides systems and methods for an enclosure system with optimized internal dynamically controllable airflow distribution. The systems include a computing system enclosure, and an electroactive film adhered to a surface of the computing system enclosure and configured to redirect airflow distribution in the computing system enclosure. In another implementation, a method monitoring airflow distribution within a computing system enclosure with a plurality of sensors, and controlling an orientation of a programmable microstructure in an electroactive film adhered to a surface of the computing system enclosure based on results of the monitoring operation. In yet another implementation, the disclosed technology includes bimetallic baffles configured for utilization in a computing system enclosure to redirect airflow distribution within the computing system enclosure.

19 Claims, 6 Drawing Sheets

(56) References Cited

U.S. PATENT DOCUMENTS

| | | |
|---|---|---|
| 2006/0075764 A1 | 4/2006 | Bash et al. |
| 2008/0269954 A1 | 10/2008 | Lev et al. |
| 2009/0097203 A1 | 4/2009 | Byers et al. |
| 2010/0057271 A1 | 3/2010 | Lewis et al. |
| 2010/0155047 A1* | 6/2010 | Lin .................... G05D 23/1932 165/288 |
| 2010/0268121 A1 | 10/2010 | Kilborn |
| 2011/0184568 A1 | 7/2011 | Tai et al. |
| 2012/0136488 A1 | 5/2012 | Tan et al. |
| 2014/0025223 A1 | 1/2014 | Chinnakkonda et al. |
| 2014/0133096 A1 | 5/2014 | Campbell et al. |
| 2015/0056908 A1* | 2/2015 | Chapel ............... H05K 7/20736 454/184 |
| 2015/0241077 A1 | 8/2015 | Ogawa et al. |
| 2016/0095250 A1* | 3/2016 | Shelnutt ............. H05K 7/20145 361/679.49 |
| 2016/0237999 A1* | 8/2016 | Cordatos ............. F04B 19/006 |

\* cited by examiner

COMPUTING SYSTEM ENCLOSURE AIRFLOW MANAGEMENT

SUMMARY

The disclosed technology includes a method and system for managing a computing system enclosure. In one implementation, the disclosed technology includes a computing system enclosure, and an electroactive film adhered to a surface of the computing system enclosure and configured to redirect airflow distribution in the computing system enclosure. In another implementation, a method includes monitoring airflow distribution within the computing system enclosure with a plurality of sensors, and controlling an orientation of a programmable microstructure in an electroactive film adhered to a surface of the computing system enclosure based on results of the monitoring operation. In yet another implementation, the disclosed technology includes bimetallic baffles configured for utilization in a computing system enclosure configured to redirect airflow distribution within the computing system enclosure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations as further illustrated in the accompanying drawings and defined in the appended claims.

These and various other features and advantages will be apparent from a reading of the following Detailed Description.

DETAILED DESCRIPTIONS

Various components in computing system enclosures (e.g., data storage arrays, storage servers, top of rack switches and converged platforms) generate heat within the system enclosures, which can have negative effects on a computing system. For example, a computing system enclosure may comprise of 80 or 90 disk drives generating heat and increased enclosure temperature requires greater component power, which can ultimately lead to system failure, if the heat is not regulated.

Many computing system enclosures include mechanical devices that assist in regulating the heat generated in the enclosures. In some computing system enclosures, the enclosure components can be cooled with forced air generated by fans. However, the power consumption of fans represents a substantial percentage of overall power consumption in the enclosure. Also, fans can have mechanical problems, such as dust accumulation or bearing degradation, which can lead to overheating and failure of a system.

Certain embodiments of the present disclosure include systems and methods for managing airflow distribution within the computing system enclosures. Implementations of such systems may dynamically control the internal airflow distribution of the computing system enclosures to optimize such internal airflow distribution. For example, the airflow distribution may be optimized to achieve higher efficiency, lower failure rates, etc. Some implementations of the technology described herein include dynamically monitoring various parameters within the computing system enclosure, analyzing the monitored parameters, and providing feedback based on the monitored results to control airflow distribution within the computing system enclosure. Such controlling of the airflow distribution includes controlling microstructures within the computing system enclosure to redirect airflow, dissipate heat, optimize fan speed power consumption, and/or reduce power consumption in the computing system enclosure.

In one implementation, the disclosed technology includes a computing system enclosure, and an electroactive film adhered to a surface of the computing system enclosure and configured to redirect airflow distribution in the computing system enclosure. In another implementation, a method is disclosed of monitoring airflow distribution within a computing system enclosure with a plurality of sensors, and controlling an orientation of a programmable microstructure in an electroactive film adhered to a surface of the computing system enclosure based on results of the monitoring operation.

In another implementation, the disclosed technology includes a bimetallic baffle in a computing system enclosure configured to redirect airflow distribution within the computing system enclosure. The bimetallic baffle comprises at least one heat reactive material reactive to a specific range of temperatures that is configured by merit of its makeup, size, shape and location within the enclosure to optimize airflow distribution within the computing system enclosure automatically, in response to the temperatures to which it is exposed.

The disclosed technology also includes using software or firmware to control the microstructures, for example, in response to changes in hot spot locations within the computing system enclosure and workload distribution of the computing system enclosure. The systems and methods disclosed herein may have applications in data centers, optically interconnected exascale data center architectures, corresponding cloud infrastructures, etc.

Figure 1:
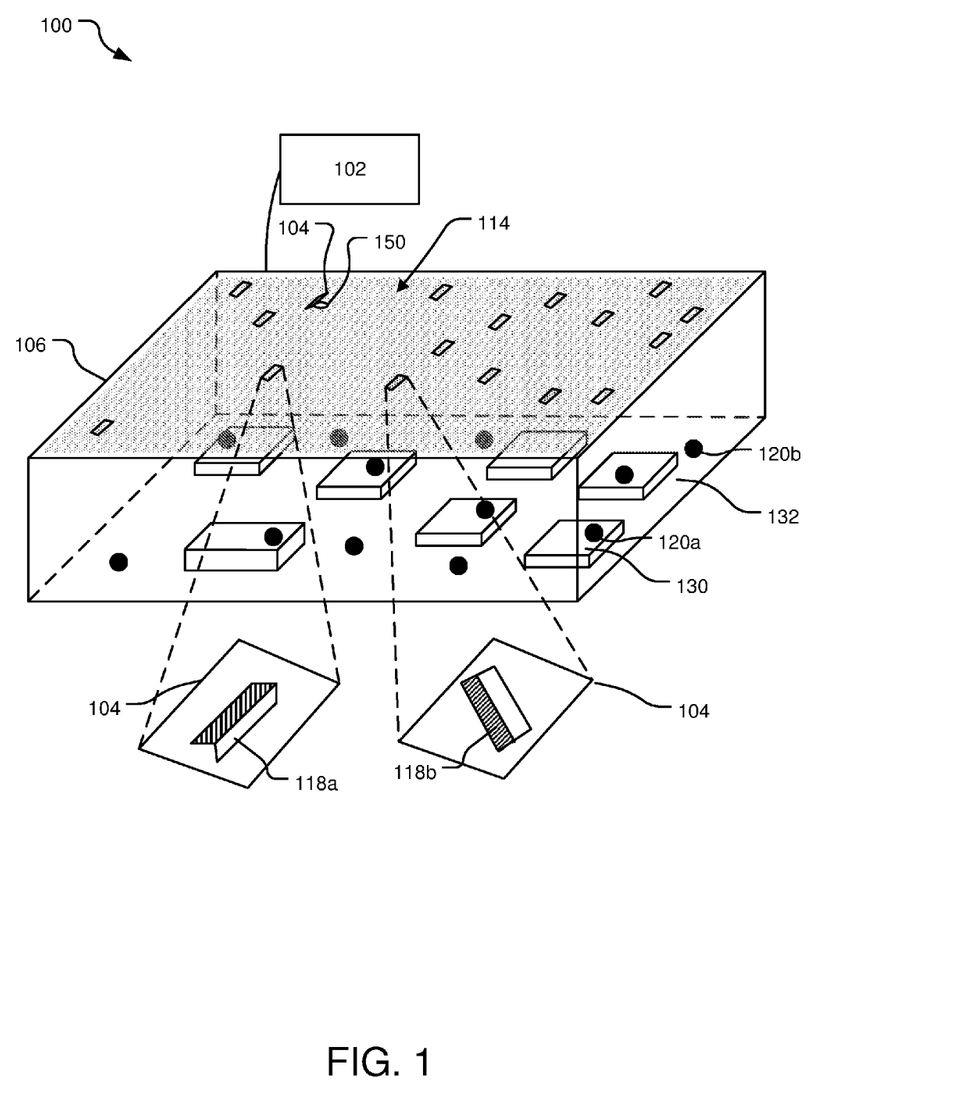
FIG. 1 illustrates a perspective isometric view of an example computing system enclosure management system including programmable microstructures on electroactive film.

FIG. 1 illustrates a perspective isometric view of an example computing system enclosure management system 100. The system 100 includes a computing system enclosure 106, which is connected to a controller 102 (e.g. a baseboard management controller (BMC)). A BMC is a specialized service processor that monitors the physical state of a computer, network server or other hardware device using sensors and communicating with the system administrator through an independent connection. This independent connection can be a communication path, such as Out-of-Band (Independent, e.g. Separate Ethernet connection) or In-Band (passed over the same interface as the data connection (e.g. SCSI Enclosure Services [SES] data passed over the Serial Attached SCSI [SAS] interface)). The BMC is part of the Intelligent Platform Management Interface (IPMI) and may be contained in the motherboard or main circuit board of a device to be monitored.

Note that while the controller 102 is illustrated as being external to the computing system enclosure 106, in actual implementations of the computing system enclosure 106, the controller 102 may be either external to the computing system enclosure 106 or internal thereto.

The computing system enclosure 106 includes electroactive film 104 that is adhered to a surface of the enclosure 106 (e.g., top end 114). The electroactive film can be adhered via a variety of mechanisms.

The electroactive film 104 may include ionic polymer metal composites with programmable microstructures 118a, 118b (hereinafter referred to as microstructures 118). The programmable microstructures 118 can aid manipulation of airflow through turbulence effects. The microstructures 118 are individually controllable microfins. By selectively activating the microstructures 118 (raising or lowering the microfin so it affects airflow), as shown in microstructure 118a, or retracting the microstructures 118 (moving the microfin so that it does not affect airflow), as shown in microstructure 118b, in different combinations, airflow can be manipulated to move along difference paths. For example, the programmable microstructures 118 can move straight to one component or move around another component. Additionally, the fins can also have limited rotational ability to improve their ability to steer the airflow.

The programmable microstructures 118 can be rotated by different degrees depending on a desired airflow. For example, the programmable microstructures 118 can be arranged in different directions (e.g., two primary directions begin at 45° and −45° to the axis of the airflow). By selecting different programmable microstructures 118 in different permutations, a high level of control flexibility can be assured.

The controller can control the shapes of the microstructures depending on current passing through. Microfins can extend into the airflow or be retracted flat against the surface to which the film is adhered, or somewhere in between, affecting the airflow to different degrees. Different shapes of microstructure are possible as well as different ways in which they can move depending on the structure. For example, microfin structures can rotate in an axis normal to the plane of the surface to which they are adhered allowing steering of air. In another example, the microfins can be on a twisted pivot that will rotate and/or retract the fin by different amounts due to electrical changes in strain.

The controller 102 of the enclosure management system 100 controls the configuration of the programmable microstructures 118, and the corresponding airflow distribution at any given time. The programmable microstructures 118 require control inputs (not shown) (e.g. 2-wire interfaces to embedded microcontrollers, which apply voltages to a 2D array of separate electroactive structures) to allow serial programming of desired configurations.

Based on the direction of the airflow, the electroactive film 104 and programmable microstructures 118 may be provided in alternative locations within the computing system enclosure 106. For example, if the airflow was to be from left to right, electroactive film 104 with programmable microstructures 118 may be provided on the left or the right surface, etc. Yet alternatively, the electroactive film 104 with programmable microstructures 118 may also be provided internally away from the sidewalls of the computing system enclosure 106. For example, a series of electroactive film 104 with programmable microstructures 118 may be provided in the middle of the computing system enclosure 106 between a front end and a rear end.

The controller 102 of the enclosure management system 100 controls the programmable microstructures 118. As workloads change over time within a computing system enclosure (e.g., change in location, number and/or intensity of hot spots, such as hot spots around a hard disk drive, a system suddenly becoming inoperative, or a reduced workload on an ASIC), changes may be required in the configurations of the programmable microstructures 118 to provide the most optimum air flow distribution subject to the constraints involved. The controller 102 dynamically monitors various parameters within the computing system enclosure 106, analyzes the monitored parameters, and provides feedback based on the monitored results to determine a profile (e.g., a computing system enclosure profile) to control airflow distribution within the computing system enclosure 106.

In FIG. 1, the controller 102 controls the microstructures 118 in response to output from sensors (e.g., sensors 120a and 120b). There can be a variety of sensors located in a variety of locations in the computing system enclosure 106. For example, a plurality of temperature sensors may be mounted on printed circuit boards (PCBs) (e.g., PCB 132), which are mounted within the computing system enclosure 106, or part of one of the field replaceable units (FRUs). For example, a cooling module may have a PCB with a fan control circuit on it, which would also have a thermal sensor. Sensors (e.g., sensor 120a) can also be located on devices (e.g., devices 130). For example, an application controller (server) may have multiple thermal sensors, some contained within the devices (CPU, dual in-time memory modules (DIMM), etc.) and some separate ones mounted on a PCB itself. Sensors may also be fitted to a midplane and/or on an operator panel at the front of the computing system enclosure 106 measuring ambient conditions. In addition to temperature, sensors can also monitor other parameters, such as actuation, vibration, and workload distribution.

The illustrated implementation of the computing system enclosure 106 is shown to have some temperature sensors 120a, 120b (hereinafter referred to as temperature sensors 120) located on the rear surface of the computing system enclosure 106. In alternative implementations, such temperature sensors 120 may be located at other locations.

The temperature sensors 120 measure temperature on a continuous or periodic basis and send such temperature measurements to the controller 102. You can also tap into the in-built temperature sensors from different ICs. These readouts can be patched to the control system, usually implemented by a BMC (baseboard management controller) which regulates the enclosure characteristics such as fan speed etc.

The controller 102 generates a temperature profile of the computing system enclosure 106 and controls the programmable microstructures 118 based on such temperature profile. The controller 102 determines whether the temperature of the computing system enclosure 106 is too high at one or more locations. For example, if the temperature profile of the computing system enclosure 106 indicates higher temperature in an upper section of the computing system enclosure 106, the controller 102 may send signals to open the electroactive film 104 on the top end 114 of the enclosure 106, close the electroactive film 104, or change the orientation of the electroactive film 104 with the programmable microstructures 118. The airflow moving in the enclosure, for example, from a back end to a front end, can dissipate the heat out the front end of the computing system enclosure 106.

In an alternative implementation, the controller 102 may dynamically measure other parameters of the computing system enclosure 106, such as the workload distribution of the computing system enclosure 106. Based on such measurements, the controller 102 determines a workload profile of the computing system enclosure and uses such workload profile to control the electroactive film 104 with the programmable microstructures 118. For example, the workload profile may be used to redirect the airflow distribution by changing the orientation (e.g., the three-dimensional orientation) of the electroactive film 104.

In another implementation, the computing system enclosure 106 may have sensors, which monitor the computing system enclosure 106 and provide feedback to the controller 102 regarding whether or not there are hot spots in the computing system enclosure 106, where such hot spots are located in the computing system enclosure 106, and the specific temperature of such hot spots. In response to the feedback, the controller 102 can signal specific programmable microstructures 118, which are located on the electroactive film 104 near the identified hot spots, and redirect airflow based on an assessment that cooling is needed near that specific hot spot. The controller 102 can send signals to the programmable microstructures 118 communicating that the orientation of the electroactive film 104 needs to change in a desired direction. Or, in another implementation, the programmable microstructures 118 may be programmable and respond to feedback directly from sensors.

In another implementation, the controller 102 determines a performance profile of the programmable microstructures 118 for feedback control. For example, sensors (e.g., a strain gauge, or magnetic reed switch-type sensors) monitor actuation of programmable microstructures 118 and provide feedback to the controller 102 regarding functioning levels of the programmable microstructures 118 and a condition of airflow distribution based on the function of the programmable microstructures 118. After determining that a specific programmable microstructure 118 is not working properly, a controller 102 may send signals to an interface (not shown) regarding malfunction and/or redirect airflow based on a deficiency of the malfunctioning programmable microstructures 118. In other implementations, the computing system enclosure management system 100 may monitor and identify the profile of other components in the computing system enclosure 106 (e.g., a specific drive downstream is overheating), and control airflow distribution via the programmable microstructures 118 and/or fans or other components to address an undesirable condition.

For example, due to the mechanical nature of programmable microstructures 118, programmable microstructures 118 can encounter mechanical failure. For example, airflow over fan blades, ducts, etc. leads to dust accumulation around edges and hinge points of programmable microstructures 118—either preventing the programmable microstructures 118 from moving, or preventing them from sealing appropriately. The computing system enclosure management system 100 dynamically monitors a computing system enclosure 106 for such conditions.

In another implementation, the programmable microstructures 118 can also be implemented into a computing system enclosure 106 such that they prevent or allow airflow. For example, the electroactive film 104 with programmable microstructures 118 may be applied to a midplane such that the programmable microstructures 118 cover a venting hole 150 when it is in the closed position. Upon activation and system control, the programmable microstructures 118 can open the electroactive film 104 to allow air to flow through the venting hole 150.

Alternatively, in other implementations, the computing system enclosure profile can comprise of multiple determined profiles (an enclosure temperature profile, a programmable microstructure performance profile, a vibration profile, a distributed airflow profile, an enclosure workload profile, etc.) that are collectively analyzed in order to control the orientation of programmable microstructures and/or fans to redirect airflow distribution in the computing system enclosure 106. Dynamically monitoring, controlling the programmable microstructures 118, and redirecting airflow distribution to or from specific locations reduces power consumption in a system that would otherwise require system-wide modifications.

In some implementations, the algorithms governing the orientations of the programmable microstructures 118 can minimize the change in resistance to airflow through the enclosure. For example, changes can be minimized in a total airflow cross-section when changing from one orientation configuration to another. Algorithms may be directed toward operating the baffles in pairs. For example, an algorithm may open one baffle in a pair and close the other baffle. Every system creates an airflow impedance or pressure drop for a particular airflow (referred to as a "PQ curve"). The algorithms can minimize disruption to the airflow impedance of the system. If the baffles significantly increase the airflow impedance of the enclosure, the airflow can drop and the system may be unable to maintain cooling. The disclosed technology includes an adaptive system. If the enclosure is not operating at a maximum configuration, the controller will sense this condition and adjust the baffles to direct the airflow accordingly—reducing the overall airflow to match the system configuration.

Figure 2:
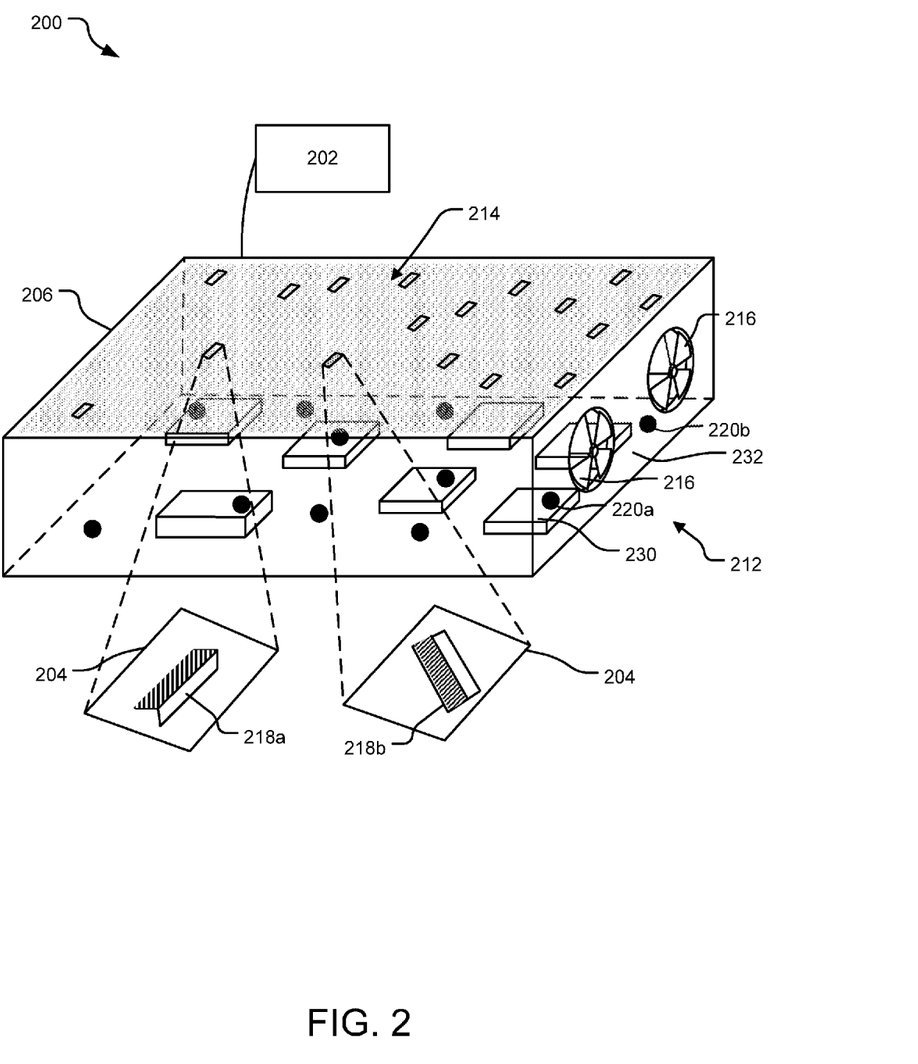
FIG. 2 illustrates a perspective isometric view of an example computing system enclosure management system including programmable microstructures on electroactive film and fans.

FIG. 2 illustrates a perspective isometric view of an example computing system enclosure management system 200 with electroactive film 204 with programmable microstructures 218 and fans 216. In conjunction with the programmable microstructures, overall fan strength can be varied, and concentrate the existing air flow over areas of the system in use and divert away from those areas not in use.

As shown, a computing system enclosure 206 is connected to a controller 202 (e.g., a BMC). Note that while the controller 202 is illustrated as being external to the computing system enclosure 206, in actual implementations of the computing system enclosure 206, the controller 202 may be either external to the computing system enclosure 206 or internal thereto.

The computing system enclosure 206 includes electroactive film 204 that is adhered to a surface of the enclosure 206 (e.g., top end 214). The electroactive film 204 can be adhered via a variety of mechanisms. The computing system enclosure 206 also includes fans 216, which can be located on various surfaces or areas of the enclosure 206. In this implementation, the fans are located on a side end 212.

The electroactive film 204 may include ionic polymer metal composites with programmable microstructures 218. The programmable microstructures 218 can aid manipulation of airflow through turbulence effects. The programmable microstructures 218 can be arranged in different directions (e.g., two primary directions begin at 45° and −45° to the axis of the airflow). By selecting different programmable microstructures 218 in different permutations, a high level of control flexibility can be assured.

The programmable microstructures 218 can be rotated by different degrees depending on a desired airflow direction. The controller 202 of the enclosure management system 200 controls the configuration of the programmable microstructures 218 and the corresponding airflow distribution at any given time. The programmable microstructures 218 require control inputs (not shown) (e.g., 2-wire interfaces to embedded microcontrollers, which apply voltages to a 2D array of separate electro-active structures) to allow serial programming of desired configurations.

Based on the direction of the airflow, the electroactive film 204 may be provided in alternative locations within the computing system enclosure 206. For example, if the airflow was to be from left to right, electroactive film 204 with programmable microstructures 218 may be provided on the left or the right surface, etc. Yet alternatively, the electroactive film 204 with programmable microstructures 218 may also be provided internally away from the sidewalls of the computing system enclosure 206. For example, a series of electroactive film 204 with programmable microstructures 218 may be provided in the middle of the computing system enclosure 206 between a front end and a rear end.

The controller 202 controls the programmable microstructures 218 and fans 216. As workloads change over time within a computing system enclosure 206 (e.g., change in location, number and/or intensity of hot spots, such as hot spots around a hard disk drive, a system suddenly becoming inoperative, or a reduced workload on an ASIC), changes may be required in the configurations of electroactive film 204 to provide the most optimum airflow distribution subject to the constraints involved.

The controller 202 dynamically monitors various parameters within the computing system enclosure 206, analyzes the monitored parameters, and provides feedback based on the monitored results to determine a profile (e.g., a computing system enclosure profile) to control airflow distribution within the computing system enclosure 206.

The temperature sensors 220a, 220b (hereinafter, referred to as temperature sensors 220) measure temperature on a continuous or periodic basis and send such temperature measurements to the controller 202. You can also tap into the in-built temperature sensors from different ICs. These readouts can be patched to the control system, usually implemented by a BMC, which regulates the enclosure characteristics such as fan speed etc.

The controller 202 generates a temperature profile of the computing system enclosure 206 and controls the programmable microstructures 218 and fans 216 based on such temperature profile. The controller 202 determines whether the temperature of the computing system enclosure 206 is too high at one or more locations. For example, if the temperature profile of the computing system enclosure 206 indicates higher temperature in one part of the enclosure 206, the controller 202 may send signals to vary fan 216 speed, and open the electroactive film 204 on the top end 214 of the enclosure 206, close the electroactive film 204, or change the orientation of the electroactive film 204 with the programmable microstructures 218. The airflow moving in the enclosure, for example, from a back end to a front end, can dissipate the heat out the front end of the enclosure 206.

In an alternative implementation, the controller 202 may dynamically measure other parameters of the computing system enclosure 206, such as the workload distribution of the computing system enclosure 206. Based on such measurements, the controller 202 determines a workload profile of the computing system enclosure and uses such workload profile to control the programmable microstructures 218 and fans 216. For example, the workload profile may be used to redirect the airflow distribution by changing the orientation (e.g., the three-dimensional orientation) of the programmable microstructures 218 and vary fan 216 speed.

In another implementation, the computing system enclosure 206 may have sensors, which monitor the enclosure 206 and provide feedback to the controller 202 regarding whether or not there are hot spots in the enclosure 206, where such hot spots are located in the enclosure 206, and the specific temperature of such hot spots.

In response to the feedback, the controller 202 can signal specific programmable microstructures 218, which are located near the identified hot spots, and redirect airflow based on an assessment that cooling is needed near that specific hot spot. The controller 202 can send signals to the programmable microstructures 218 communicating that the orientation of the electroactive film 204 need to change in a desired direction. Or, in another implementation, the programmable microstructures 218 may be programmable and respond to feedback directly from sensors.

In another implementation, the controller 202 determines a performance profile of the programmable microstructures 218 and fans 216. For example, sensors (e.g., a strain gauge, or magnetic reed switch-type sensors) monitor actuation of programmable microstructures 218 and fans 216 and provide feedback to the controller 202 regarding functioning levels of the programmable microstructures 218 and fans 216 and a condition of airflow distribution based on the function of the programmable microstructures 218. After determining that specific programmable microstructures 218 and/or fan 216 is not working properly, a controller 202 may send signals to an interface (not shown) regarding malfunction and/or redirect airflow distribution based on a deficiency of the malfunctioning programmable microstructures 218 and/or fans 216. In other implementations, the management system 200 may monitor and identify the profile of other components in the enclosure 206 (e.g., a specific drive is overheating), and control airflow via the programmable microstructures 218 and/or fans 216 or other components to address an undesirable condition.

For example, due to the mechanical nature of programmable microstructures 218 and/or fans 216, programmable microstructures 218 and/or fans 216 can encounter mechanical failure. For example, airflow over fan blades, ducts, etc. leads to dust accumulation around edges and hinge points of programmable microstructures 218 and/or fans 216—either preventing the programmable microstructures 218 and/or fans 216 from moving, or preventing them from sealing appropriately. The computer management system 200 dynamically monitors an enclosure 206 for such conditions.

Alternatively, in other implementations, the computing system enclosure profile can comprise of multiple determined profiles (an enclosure temperature profile, a programmable microstructures 218 and/or fans 216 performance profile, a vibration profile, a distributed airflow profile, an enclosure workload profile, etc.) that are collectively analyzed in order to control the orientation of programmable microstructures 218 and/or fans 216 to redirect airflow distribution in an enclosure 206. Dynamically monitoring, controlling the electroactive film 204, programmable microstructures 218 and/or fans 216, and redirecting airflow distribution to or from specific locations reduces power consumption in a system that would otherwise require system-wide modifications.

Figure 3:
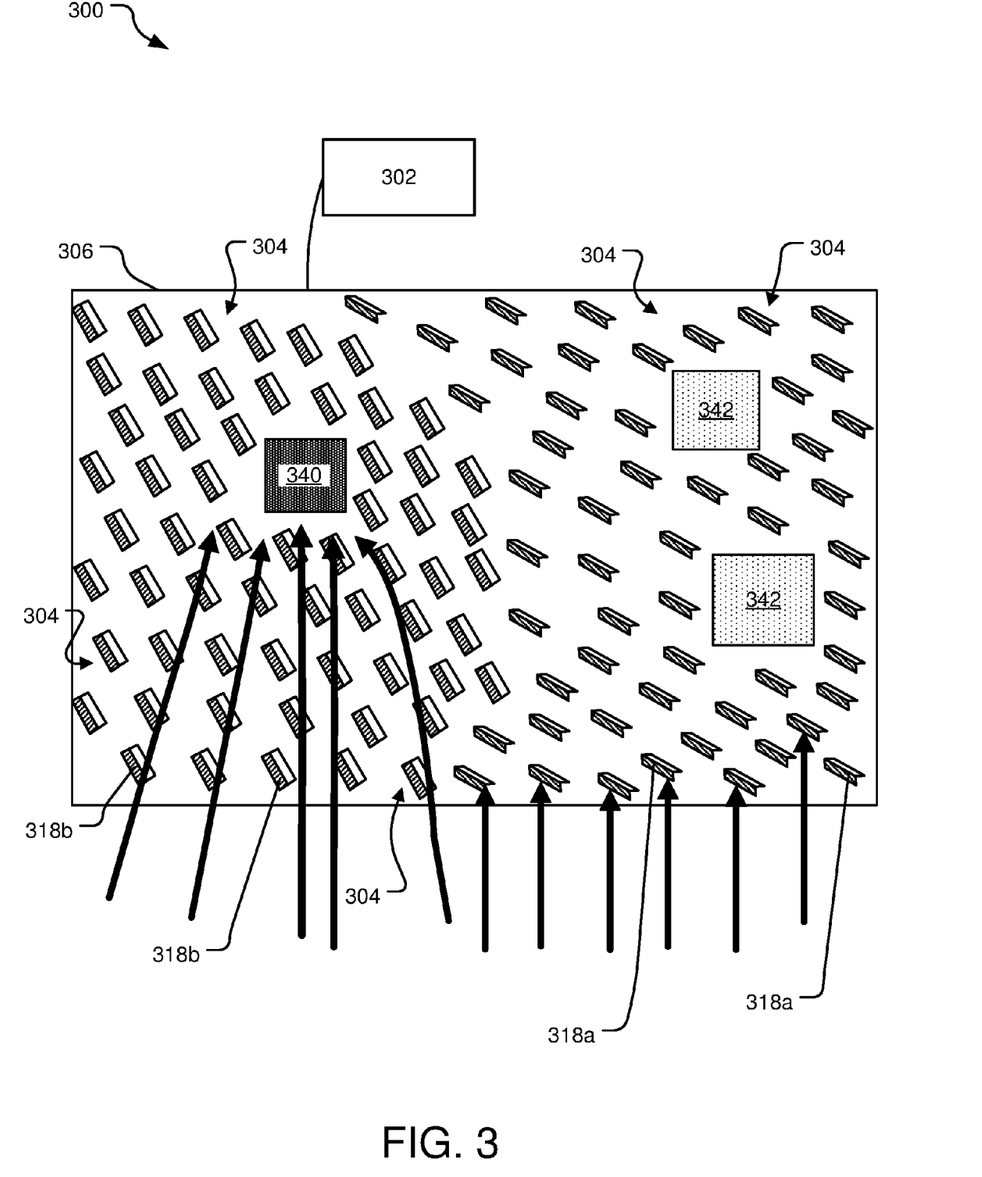
FIG. 3 illustrates a perspective isometric view of an example computing system enclosure management system including activated and deactivated programmable microstructures on electroactive film.

FIG. 3 illustrates a perspective isometric view of an example computing system enclosure management system 300 including activated and deactivated programmable microstructures 318 on electroactive film 304. The system 300 includes a computing system enclosure 306, which is connected to a controller 302 (e.g., a BMC).

Note that while the controller 302 is illustrated as being external to the computing system enclosure 306, in actual implementations of the computing system enclosure 306, the controller 302 may be either external to the computing system enclosure 306 or internal thereto.

The computing system enclosure 306 includes electroactive film 304, which may include ionic polymer metal composites with programmable microstructures 318a, 318b (hereinafter, referred to as microstructures 318). The programmable microstructures 318 can aid manipulation of airflow through turbulence effects. The microstructures 318 are individually controllable microfins.

FIG. 3 illustrates that by selectively activating and deactivating the microstructures 318, airflow can be manipulated to move along difference paths. The programmable microstructures 318 can be rotated by different degrees depending on a desired airflow. As shown in FIG. 3, programmable microstructures 318a are activated (i.e., the microfins are raised). As a result, airflow coming into the computing system enclosure 306 is prevented from going toward cold spots or areas 342. Programmable microstructures 318b are deactivated (i.e., the microfins are lowered) so that the microfins do not affect airflow. As a result, airflow is able to enter the computing system enclosure 306, move toward the hot spot or area 340 for cooling.

The controller 302 can control the shapes of the programmable microstructures 318 depending on current passing through. Microfins can extend into the airflow or be retracted flat against the surface to which the film is adhered, or somewhere in between, affecting the airflow to different degrees. Different shapes of microstructure are possible as well as different ways in which they can move depending on the structure. For example, microfin structures can rotate in an axis normal to the plane of the surface to which they are adhered allowing steering of air. In another example, the microfins can be on a twisted pivot that will rotate and/or retract the fin by different amounts due to electrically changes in strain.

The controller 302 of the enclosure management system 300 controls the configuration of the programmable microstructures 318, and the corresponding airflow distribution at any given time. The programmable microstructures 318 require control inputs (not shown) to allow serial programming of desired configurations. In one implementation, the inputs can be 2-wire interfaces to embedded microcontrollers, which apply voltages to a 2D array of separate electroactive structures. In other implementations, programmable microstructures could be placed on midplanes, FRUs, surfaces of the enclosure or controllers, etc. The programmable microstructures can be coordinated by microcontrollers (e.g., one microcontroller in each Canister (e.g., Controller/JBOD etc.)) to provide redundant control in the event of FRU failure.

As workloads change over time within a computing system enclosure (e.g., change in location, number and/or intensity of hot spots, such as hot spots around a hard disk drive, a system suddenly becoming inoperative, or a reduced workload on an ASIC), changes may be required in the configurations of the programmable microstructures 318 to provide the most optimum air flow distribution subject to the constraints involved. The controller 302 dynamically monitors various parameters within the computing system enclosure 306, analyzes the monitored parameters, and provides feedback based on the monitored results to determine a profile (e.g., a computing system enclosure profile) to control airflow distribution within the computing system enclosure 306.

Figure 4:
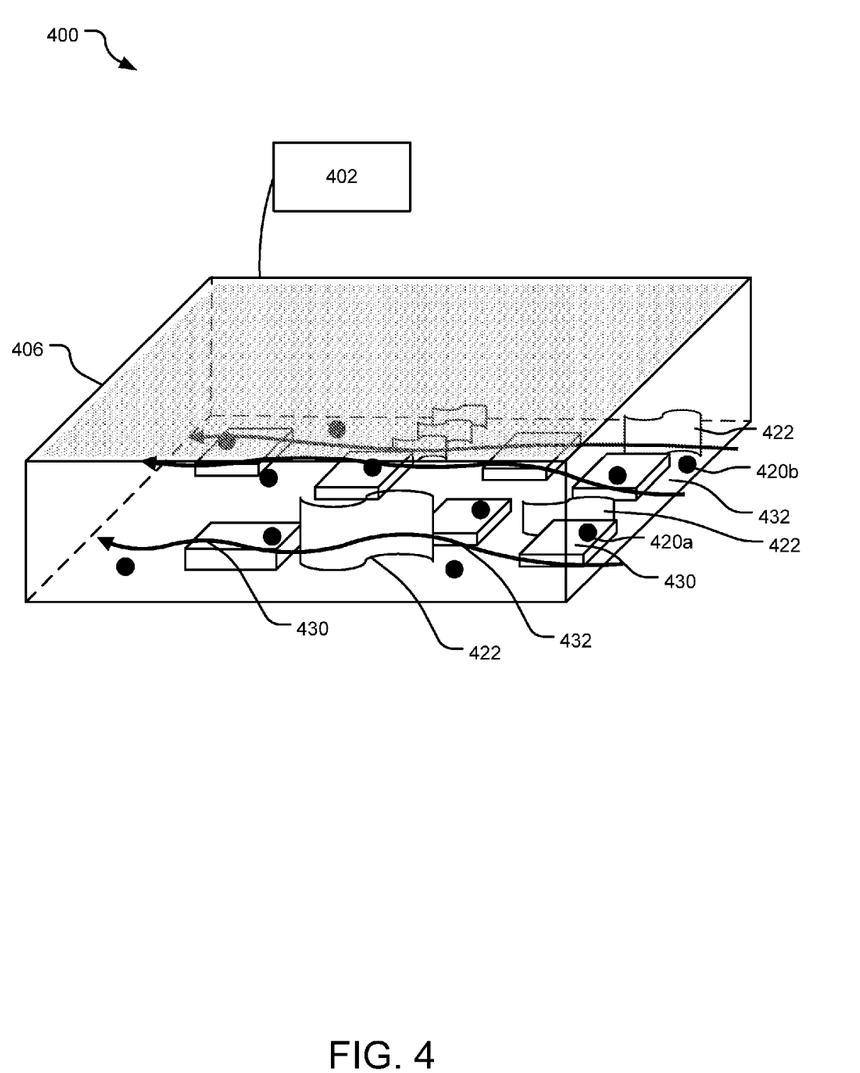
FIG. 4 illustrates a perspective isometric view of an example computing system enclosure management system including bimetallic baffles.

FIG. 4 illustrates a perspective isometric view of an example computing system enclosure management system 400 with bimetallic baffles 422. The system 400 includes a computing system enclosure 406, which is connected to a controller 402. Sensors (sensors 420a and 420b) may be located in the computing system enclosure 406 in a variety of locations.

For example, a plurality of temperature sensors may be mounted on printed circuit boards (PCBs) (e.g., PCB 432), which are mounted within the computing system enclosure 406, or part of one of the field replaceable units (FRUs). For example, a cooling module may have a PCB with a fan control circuit on it, which would also have a thermal sensor. Sensors (e.g., sensor 420a) can also be located on devices (e.g., devices 430). For example, an application controller (server) may have multiple thermal sensors, some contained within the devices (CPU, dual in-time memory modules (DIMM), etc.) and some separate ones mounted on a PCB itself. Sensors may also be fitted to a midplane and/or on an operator panel at the front of the computing system enclosure 406 measuring ambient conditions. In addition to temperature, sensors can also monitor other parameters, such as actuation, vibration, and workload distribution.

As workloads change over time within a computing system enclosure (e.g., change in location, number and/or intensity of hot spots, such as hot spots around a hard disk drive, a system suddenly becoming inoperative, or a reduced workload on an ASIC), changes may be required in the configurations of baffling structures to provide the most optimum air flow distribution subject to the constraints involved.

In addition to mechanically controlling components in the system to optimize airflow, a bimetallic strip or material can be used in the bimetallic baffles 422 to convert a temperature change into mechanical displacement. The bimetallic material reacts to temperature by changing the orientation (e.g., the three-dimensional orientation) of the bimetallic baffles 422 for airflow distribution redirection.

The bimetallic baffles 422 can be various sizes and shapes and be located on various internal or external surfaces of the computing system enclosure 406. The direction of airflow distribution in an enclosure 406 can vary. The bimetallic baffles 422 are configured (by fabrication, shape, make up, distribution of areas which respond in varying degrees to temperature) to deform automatically in response to a temperature profile. For example, a temperature profile representing a certain distribution of hot spots can induce the bimetallic baffles 422 such as to steer airflow over hot spots and away from cold spots, reaching an equilibrium state which coincides with optimal air flow.

The bimetallic baffles 422 in FIG. 4 are placed in different key locations in the computing system enclosure 406, which can affect large-scale changes in airflow direction. The bimetallic material of the bimetallic baffles 422 controls the configuration of the baffling structures, and the corresponding airflow distribution at any given time. The bimetallic baffles 422 include bimetallic strip or material (or a combination of materials) that has a direct (predetermined)

mechanical reaction to a specific heat range being applied. The bimetallic baffles 422 automatically provide a required amount of force to open, or close, or otherwise deform a baffle. A bimetallic material of certain specifications and mechanical properties can be selected to react to a specific range of temperatures, for a specified kind of movement (e.g., opening or closing baffles), and for a specified period of time (e.g., until the computing system enclosure 406 or a specific hot spot area in a computing system enclosure 406 reaches a specified temperature) for the desired computing system enclosure 406. The bimetallic strips in the bimetallic baffles 422 are responsive and reliable over long periods of usage.

In one implementation, to generate a relatively large amount of movement for a relatively small temperature fluctuation, a coiled bimetallic strip is used in a bimetallic baffle 422 as the mechanical driver of the bimetallic baffle 422. A bimetallic strip wrapped into a coil provides compactness. The greater length of the coiled shape provides improved sensitivity. However, in other implementations, a linear bimetallic strip can be used in a baffle in certain areas of an enclosure where space does not permit a coiled arrangement.

In another implementation, a bimetallic baffle 422 consists of two strips of different metals, which expand at different rates as they are heated (e.g., steel, copper, brass, etc.). The strips are joined together by a variety of attaching mechanisms (e.g., riveting, brazing, welding, etc.). The different expansions force a flat strip to bend one way if heated, and in an opposite direction if cooled below its initial temperature. The metal with the higher coefficient of thermal expansion is on the outer side of the curve when the strip is heated and on the inner side when cooled. The sideways displacement of the bimetallic strip is much larger than the small lengthways expansion in either of the two metals.

In other implementations, more complex structures can include the bimetallic material to deform and reshape baffles in different ways (e.g., varying the distribution of different metal types and pairings).

Figure 5:
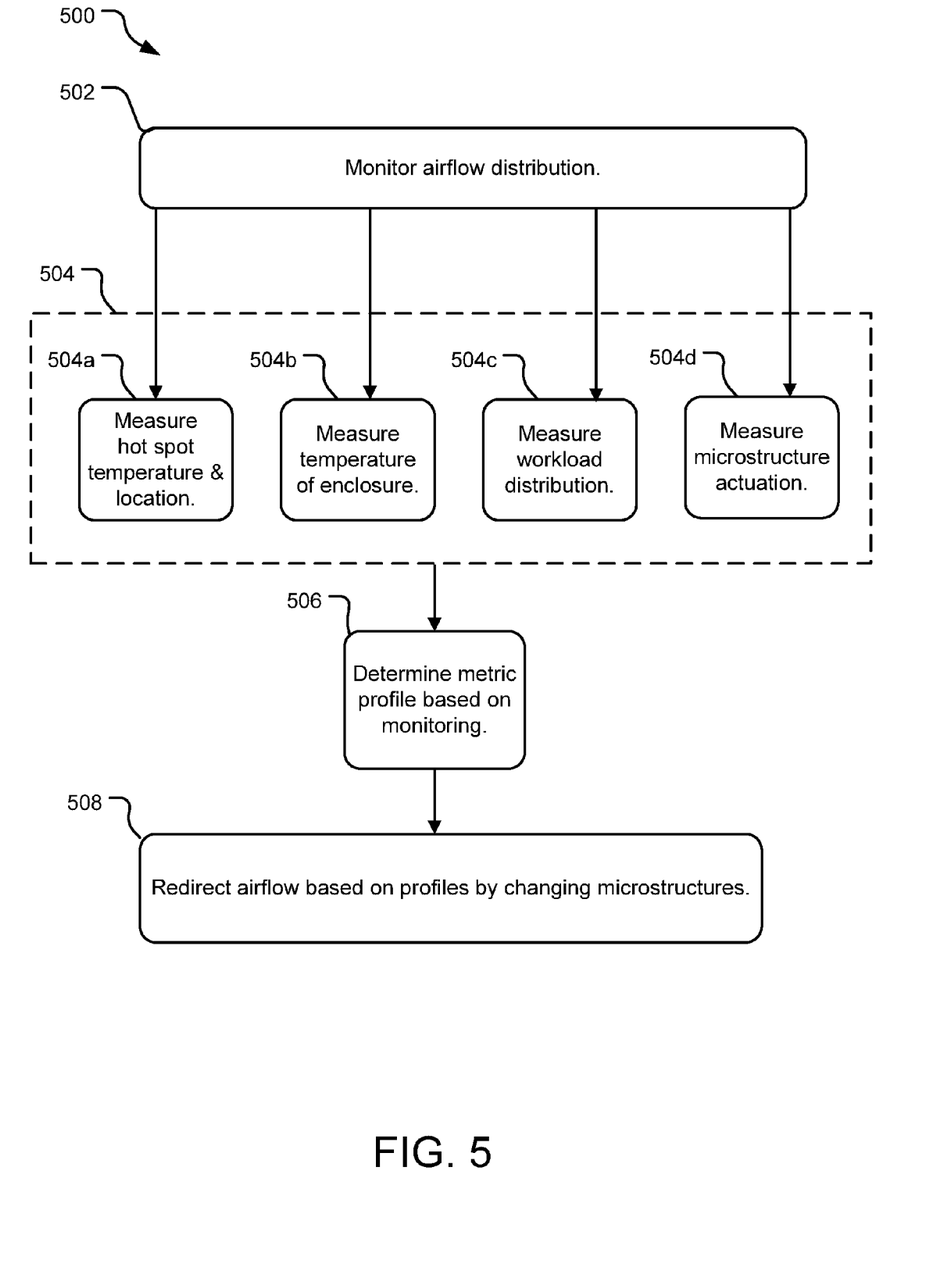
FIG. 5 illustrates example operations for redirection of airflow in an example computing system enclosure management system including electroactive film with programmable microstructures.

FIG. 5 illustrates example operations 500 for redirection of airflow in an example computing system enclosure management system that includes changing the orientation of microstructures in electroactive film. As workloads change over time within a computing system enclosure (e.g., change in location, number and/or intensity of hot spots, such as hot spots around a hard disk drive, or a system suddenly becoming inoperative, or has a reduced workload on an ASIC), changes may be required in the configurations of enclosure components to provide the most optimum air flow distribution subject to the constraints involved. These required changes can be identified by monitoring the system.

A monitoring operation 502 monitors airflow distribution by monitoring various parameters (e.g., presence, location, and temperature of hot spots, temperature, workload distribution, actuation, and vibration) within a computing system enclosure. The controller performs the monitoring, and it can be done dynamically. In metric operations 504, metrics operations measure various monitored parameters in the computer system enclosure.

In measuring operation 504*a*, a sensor may dynamically monitor the temperature of hot spots in the computing system enclosure and provide measured outputs regarding presence, location, and temperature. In measuring operation 504*b*, a temperature sensor may dynamically monitor the overall temperature of the computing system enclosure and provide a measured output. In measuring operation 504*c*, sensors measure workload distribution of the computing system enclosure. In measuring operation 504*d*, sensors (e.g., a strain gauge, or magnetic reed switch-type sensors) monitor actuation of enclosure components (e.g., electroactive film, programmable microstructures, fans, etc.) and provide measured outputs regarding the component functioning levels.

In a determining operation 506, computing system enclosure profiles are determined based on monitored results of airflow distribution. The controller determines a computing system enclosure profile (e.g., a hot spot location and temperature profile, a temperature profile, a workload distribution profile, and a performance profile) based on the measured parameters, and provides feedback to the controller regarding the computing system enclosure. In some implementations, the computing system enclosure profile can comprise of multiple determined profiles that are collectively analyzed by the controller.

For example, operation 506 may determine a temperature profile based on the overall temperature of the enclosure, or areas in the enclosure where hot spots are present. The temperature profile may be supported by software and/or hardware that compiles monitoring results and calculates whether or not operations need to take place to manage the temperature in the enclosure. Likewise, in an example where actuation of programmable microstructures is monitored, a performance profile may be determined in an operation 506 and supported by software and/or hardware that compiles monitoring results and calculates whether or not operations need to take place to remedy any malfunctioning or mechanically failing programmable microstructures. The controller receives feedback regarding the determined profiles from the measured outputs and can send signals to initiate operation to modify the airflow distribution.

An operation 508 redirects airflow distribution in the computing system enclosure. The computing system enclosure management system controls the orientation of one or more programmable microstructures and/or fans based on a determined computing system enclosure profile from operations 502-506. For example, if a controller of a computing system enclosure monitors an enclosure, sensors measure an overall temperature, and a temperature profile determines that the overall temperature is too high. Airflow distribution can be redirected by activating programmable microstructures in specific areas for heat to dissipate or for cool air to flow. In another example, in conjunction with the programmable microstructures, overall fan strength can be varied, and concentrate the existing air flow over areas of the system in use and divert air away from those areas not in use.

The redirection of airflow distribution is performed while maintaining the total pressure profile in the enclosure as part of system management. For example, the orientation of the microstructures is changed while making sure that fans do not stall and overheat the system downstream. The overall effect of the change in airflow distribution is taken into consideration.

The operations 502-508 can all occur dynamically, sequentially, and/or simultaneously, optimizing the airflow distribution within a computing system enclosure. As a result, power consumption is reduced.

Figure 6:
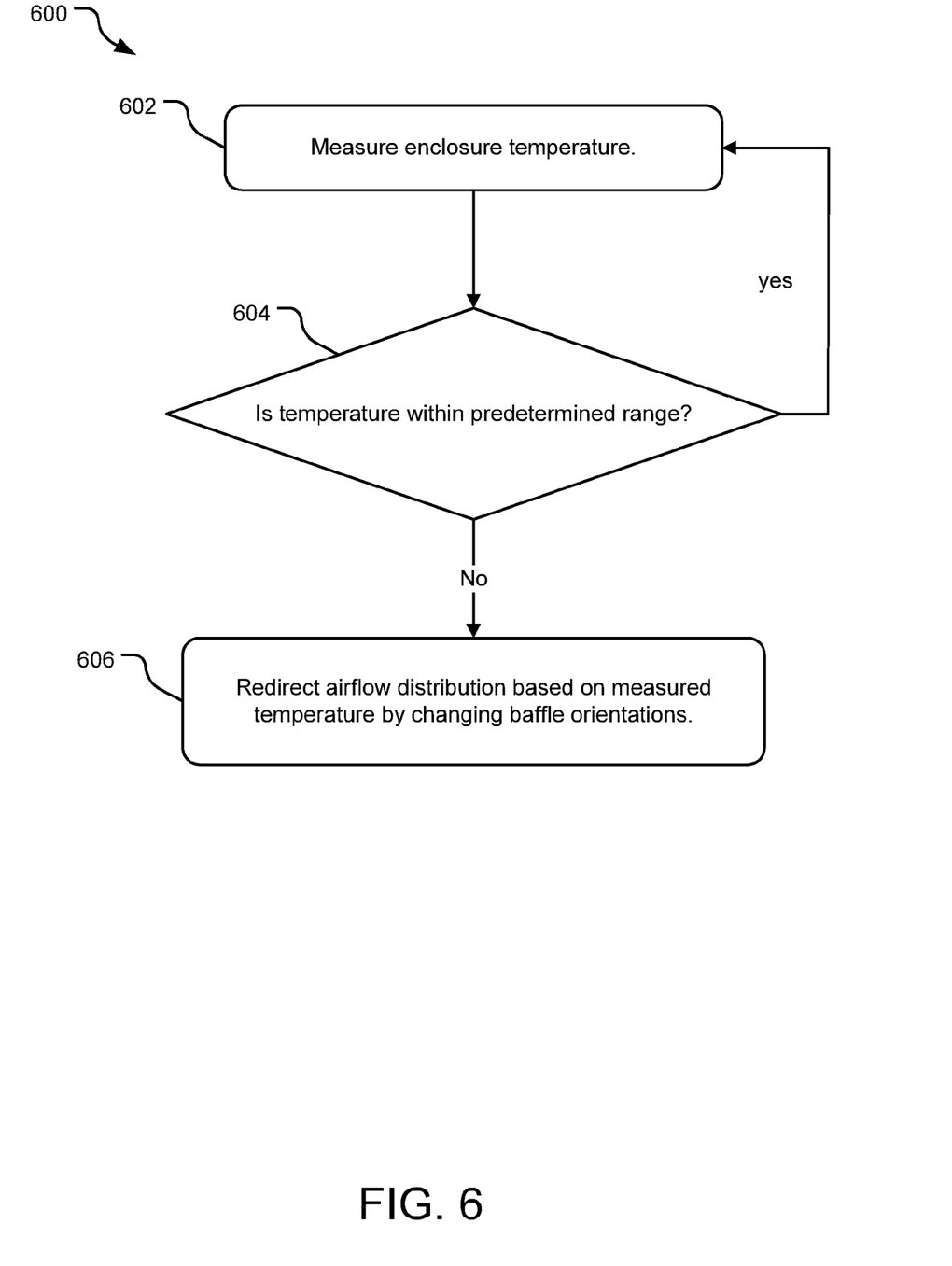
FIG. 6 illustrates example operations for redirection of airflow in a second example computing system enclosure management system including bimetallic baffles.

FIG. 6 illustrates example operations 600 for redirection of airflow in a second example computing system enclosure management system including, bimetallic baffles. As workloads change over time within a computing system enclosure (e.g., change in location, number and/or intensity of hot spots, such as hot spots around a hard disk drive, a system suddenly becoming inoperative, or a reduced workload on an ASIC), changes may be required in the configurations of baffling structures to provide the most optimum air flow distribution subject to the constraints involved.

In an operation 602, a temperature of a computing system enclosure is measured or detected by the bimetallic baffles. An operation 604 reactively determines whether or not the measured temperature is within a predetermined temperature range. If the measured temperature is within a predetermined temperature range, then the operation 602 occurs again, continuously until the measured temperature is outside a predetermined temperature range. When the measured temperature is outside a predetermined temperature range, an operation 606 is activated.

An operation 606 redirects airflow distribution in the computing system enclosure by changing the orientation of bimetallic baffles, which include bimetallic material. A bimetallic strip or material converts a temperature change into mechanical displacement. The bimetallic material reacts to temperature by changing the orientation (e.g., the three-dimensional orientation) of the bimetallic baffles or airflow distribution redirection.

The bimetallic baffles are rotated by different degrees depending on a desired airflow. The bimetallic material of the bimetallic baffles controls the configuration of the baffling structures, and the corresponding airflow distribution at any given time. The bimetallic baffles include material (or a combination of materials) that has a direct (predetermined) mechanical reaction to a specific heat range being applied. A bimetallic material automatically provides a required amount of force to open or close a baffle. A bimetallic material of certain specifications and mechanical properties can be selected to react to a predetermined range of temperatures, for a specified kind of movement (e.g., opening or closing baffles), and for a specified period of time (e.g., until the enclosure or a specific hot spot area in an enclosure reaches a specified temperature) for a desired enclosure.

In one implementation, a bimetallic strip consists of two strips of different metals, which expand at different rates as they are heated (e.g., steel, copper, brass, etc.). The strips are joined together by a variety of attaching mechanisms (e.g., riveting, brazing, welding, etc.). The different expansions force a flat strip to bend one way if heated, and in an opposite direction if cooled below its initial temperature. The metal with the higher coefficient of thermal expansion is on the outer side of the curve when the strip is heated and on the inner side when cooled. The sideways displacement of the bimetallic strip is much larger than the small lengthways expansion in either of the two metals. The bimetallic material in the bimetallic baffles is responsive and reliable over long periods of usage.

The logical operations making up the embodiments of the invention described herein are referred to variously as operations, steps, objects, or modules. Furthermore, it should be understood that logical operations may be performed in any order, adding or omitting operations as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A system comprising:
    a computing system enclosure; and
    electroactive film adhered to a surface of the computing system enclosure and configured to redirect airflow distribution in the computing system enclosure, the electroactive film including a programmable microstructure.

2. The system of claim 1, wherein the programmable microstructure is configured to change orientation dynamically to redirect airflow distribution.

3. The system of claim 1, wherein the electroactive film is further adhered to a midplane in the computing system enclosure to redirect airflow distribution of a venting hole.

4. The system of claim 1, wherein the programmable microstructure is configured to redirect airflow distribution based on a determined computing system enclosure profile.

5. The system of claim 4, wherein the determined computing system enclosure profile includes a determined workload distribution within the computing system enclosure.

6. The system of claim 1, wherein the programmable microstructure is configured to redirect airflow distribution based on a determined performance profile of the programmable microstructure.

7. The system of claim 1, wherein the programmable microstructure is configured to redirect airflow distribution based on a determined temperature profile of the computing system enclosure.

8. The system of claim 2, further comprising a plurality of sensors configured to identify at least one of a presence of a hot spot, a location of the hot spot, and a temperature of the hot spot in the computing system enclosure.

9. The system of claim 8, wherein the programmable microstructure is configured to redirect airflow distribution based on the identification of at least one of a presence of a hot spot, a location of the hot spot, and a temperature of the hot spot in the computing system enclosure.

10. The system of claim 2, further comprising a plurality of fans configured to operate in conjunction with the programmable microstructure in redirection of airflow distribution.

11. A method comprising:
    monitoring airflow distribution within a computing system enclosure with a plurality of sensors; and
    controlling an orientation of a programmable microstructure in an electroactive film adhered to a surface of the computing system enclosure based on results of the monitoring operation.

12. The method of claim 11, further comprising determining a computing system enclosure profile based on the monitoring operation results.

13. The method of claim 11, further comprising monitoring actuation of the programmable microstructure in the computing system enclosure.

14. The method of claim 11, further comprising monitoring a temperature of the computing system enclosure.

15. The method of claim 11, further comprising identifying at least one of a presence of a hot spot, a location of a hot spot, and a temperature of a hot spot in the computing system enclosure.

16. The method of claim 11, further comprising determining a workload distribution in the computing system enclosure.

17. An apparatus comprising:
    a heat reactive bimetallic strip baffle comprising a programmable microstructure configured for utilization in a computing system enclosure configured to redirect airflow distribution within the computing system enclosure.

18. The apparatus of claim 17, wherein the heat reactive bimetallic strip baffle further comprises a heat reactive material and is structured as a strip.

19. The apparatus of claim 17, wherein the heat reactive bimetallic strip baffle[s] redirects airflow distribution within the computing system enclosure automatically in response to a temperature measurement outside a predetermined temperature range.

\* \* \* \* \*